(12) United States Patent
Yamanoue

(10) Patent No.: US 12,279,404 B2
(45) Date of Patent: Apr. 15, 2025

(54) INVERTER

(71) Applicant: Mazda Motor Corporation, Hiroshima (JP)

(72) Inventor: Kouichi Yamanoue, Hiroshima (JP)

(73) Assignee: MAZDA MOTOR CORPORATION, Hiroshima (JP)

( * ) Notice: Subject to any disclaimer, the term of this patent is extended or adjusted under 35 U.S.C. 154(b) by 278 days.

(21) Appl. No.: 18/125,122

(22) Filed: Mar. 23, 2023

(65) Prior Publication Data

US 2024/0032266 A1    Jan. 25, 2024

(30) Foreign Application Priority Data

Jul. 25, 2022    (JP) ................ 2022-118119

(51) Int. Cl.
| | |
|---|---|
| *H05K 7/20* | (2006.01) |
| *H02M 1/12* | (2006.01) |
| *H02M 7/00* | (2006.01) |
| *H02M 7/483* | (2007.01) |
| *H02P 27/06* | (2006.01) |

(52) U.S. Cl.
CPC ........ *H05K 7/20936* (2013.01); *H02M 1/123* (2021.05); *H02M 7/003* (2013.01); *H02M 7/483* (2013.01); *H02P 27/06* (2013.01); *H05K 7/209* (2013.01)

(58) Field of Classification Search
CPC .................................................. H05K 7/20936
See application file for complete search history.

(56) References Cited

U.S. PATENT DOCUMENTS

| | | | |
|---|---|---|---|
| 6,219,245 B1* | 4/2001 | Nagashima | ........... H01L 23/473 |
| | | | 257/E23.098 |
| 2009/0194862 A1* | 8/2009 | Kitami | ................ H01L 23/4334 |
| | | | 257/706 |
| 2018/0337107 A1 | 11/2018 | Kida et al. | |
| 2019/0385772 A1* | 12/2019 | Denham | ................ H01F 7/0231 |

FOREIGN PATENT DOCUMENTS

| | | | |
|---|---|---|---|
| JP | H09298889 A | * | 11/1997 |
| JP | 2018-195694 A | | 12/2018 |

* cited by examiner

*Primary Examiner* — Mukundbhai G Patel
(74) *Attorney, Agent, or Firm* — XSENSUS LLP

(57) ABSTRACT

Provided is an inverter 1 configured such that an electric component portion 1a is integrated with a cooling portion 1b. A switching module 20 includes a heat sink 102 joined to the lower surface of a substrate 101. The cooling portion 1b includes an electric conductive cooler 10 forming a refrigerant flow path 11. The switching module 20 is attached to the cooler 10 such that a heat radiation portion 102d of the heat sink 102 is exposed to the inside of the cooler 10. A common mode current suppression structure 21 including an insulating member is interposed between the heat sink 102 and the cooler 10 to electrically insulate the heat sink 102 and the cooler 10 from each other.

18 Claims, 17 Drawing Sheets

INVERTER

CROSS-REFERENCE TO RELATED APPLICATION

The present application claims priority to Japanese Patent Application No. 2022-118119 filed on Jul. 25, 2022, the entire contents of which are incorporated herein by reference.

BACKGROUND

The technique disclosed herein relates to an inverter. Particularly, the technique relates to an in-vehicle inverter.

BACKGROUND

In recent years, vehicles have been increasingly motorized. In hybrid vehicles, electric vehicles, etc. traveling with electricity, inverters are mounted together with high-voltage drive batteries in order to rotate drive motors for traveling.

The inverter converts the DC voltage of the drive battery into three-phase AC voltage to output the AC voltage to the drive motor. Thus, the inverter is provided with an inverter circuit including a plurality of switching elements (semiconductor chips) on which switching control is performed. In order to improve the efficiency of the inverter, there has been a demand for speeding-up of the switching control for the inverter.

However, when the switching control speeds up, common mode current flows in an unexpected current path due to a voltage change. More specifically, common mode current flows in a current path passing through a stray capacitance (parasitic capacitance) and the ground (earth).

For this reason, there is a problem that harmonic noise (so-called common mode noise) occurs. The common mode noise would cause malfunction of electric devices located nearby, communication disturbance, etc. For this reason, in order to speed up the switching control, it is inevitable to suppress the common mode noise.

In order to suppress the common mode noise, various techniques have been proposed. For example, Patent Unexamined Patent Publication No. 2018-195694 discloses a technique of reducing common mode noise generated in a half-bridge circuit configured such that two switching elements are connected in series.

In the case of the half-bridge circuit, a voltage change is great at a midpoint between the two switching elements. Thus, in the technique of Patent Unexamined Patent Publication No. 2018-195694, a heat sink (second heat sink 19) facing a conductive plate (midpoint conductive plate 15) at the midpoint via an insulating layer 31 is insulated from a ground terminal 24 (for the sake of easy explanation, reference numerals in Patent Unexamined Patent Publication No. 2018-195694 are used herein for explaining Patent Unexamined Patent Publication No. 2018-195694).

With this configuration, the common mode noise flowing from the midpoint conductive plate 15 is reduced.

SUMMARY

Technical Problem

The technique of Patent Unexamined Patent Publication No. 2018-195694, in which, for example, two insulating members and three heat sinks need to be joined to each other at end surfaces and be formed in a plate shape, is disadvantageously complicate in structure and therefore difficult to manufacture.

Thus, the technique disclosed herein has an object of effectively suppressing common mode noise with a relatively-simple structure by devising an overall structure of an inverter.

Solution to the Problems

The technique disclosed herein relates to an inverter including an electric component portion housing an electronic component including a switching module and integrated with a cooling portion.

The switching module includes: an insulating layer having, on the upper surface thereof, an electronic circuit including an inverter circuit; and a heat sink having, at the upper portion thereof, a heat receiving portion joined to the lower surface of the insulating layer and having, at the lower portion thereof, a heat radiation portion. The cooling portion includes an electric conductive cooler forming a refrigerant flow path.

The switching module is attached to the cooler such that the heat radiation portion is exposed to the inside of the cooler through a fitting port, and the inverter includes a common mode current suppression structure including an insulating member and being interposed between the heat sink and the cooler to electrically insulate the heat sink and the cooler from each other.

That is, during operation of the inverter, high-speed ON-OFF operation is performed in the inverter circuit by switching control. Accordingly, DC power is converted into AC power. At this point, the voltage of the inverter circuit changes intermittently.

The inverter circuit and the heat sink are electrically insulated from each other by the insulating layer. This structure is a structure (virtual capacitor) in which charge would be accumulated as in a capacitor, and a stray capacitance would be generated. Due to this virtual capacitor, a current path, in which common mode current would flow when the voltage is intermittently changed by the switching control, would be formed.

On the other hand, in the inverter, the common mode current suppression structure including the insulating member is interposed between the heat sink and the cooler to electrically insulate the heat sink and the cooler from each other. Thus, a virtual capacitor where a stray capacitance would be generated is further formed downstream of the above-described portion. Accordingly, no common mode current directly flows to the cooler.

As will be described later, the common mode current flows between the heat sink and the cooler facing each other via the insulating member and between the heat radiation portion of the heat sink and the cooler facing each other via the refrigerant. That is, the common mode current is distributed to a current path passing through a plurality of virtual capacitors.

As a result, since the common mode current is reduced, the common mode noise can be suppressed. Since the insulating member is interposed between the heat sink and the cooler, the structure is relatively simple and is easily made.

For example, in a configuration where the switching module further includes an insulating case cover covering the insulating layer, an end portion of the case cover may be fitted in the fitting port to form the common mode current suppression structure.

Since merely a part of the case cover needs to be changed, the cooler is not changed, leading to cost reduction.

The cooling portion may further include an insulating frame member forming the fitting port, and the frame member may be attached to the cooling portion to form the common mode current suppression structure.

In this case, since the switching module is not changed, an existing product can be used. Excellent versatility is obtained.

The common mode current suppression structure may include an electric conductive layer embedded in the insulating member, and opposing portions of the heat sink and the cooler may be divided by the electric conductive layer electrically insulatively from each other, and the electric conductive layer may be electrically connected to a constant potential portion in the electric component portion held at a predetermined potential.

The constant potential portion is held at the predetermined potential. Thus, the potential of the conductive layer is kept constant. Thus, there is no potential difference between the electric conductive layer and the cooler. Accordingly, no charge is accumulated between the electric conductive layer and the cooler. As a result, no common mode current substantially flows between the heat sink and the cooler facing each other via the insulating member.

Accordingly, the common mode current flows between the heat radiation portion of the heat sink and the cooler facing each other via the refrigerant. The common mode noise can be effectively reduced. Thus, the switching control can be speeded up.

The constant potential portion may be a portion of a negative-side line connected to the inverter circuit, or may be a portion of a positive-side line connected to the inverter circuit.

In a case where the inverter further includes two capacitors connected in series between a positive-side line and a negative-side line to which the inverter circuit is connected, the constant potential portion may be a portion between the two capacitors.

At any of these portions, the predetermined potential is held during execution of the switching control. Thus, the potential of the conductive layer can be kept constant if the conductive layer is connected to any of these portions.

In a case where the switching module further includes an insulating case cover covering the insulating layer and an end portion of the case cover is fitted in the fitting port to form the common mode current suppression structure, the conductive layer may have a connection end portion exposed to an inside of the case cover, and the conductive layer and the constant potential portion may be connected to each other via the connection end portion.

In this case, the conductive layer is provided in the switching module having the constant potential portion. Moreover, the conductive layer is embedded in the end portion of the case cover. Thus, the conductive layer and the constant potential portion can be directly connected to each other through the inside of the case cover. The structure can be simple and easily put into practice. Since the connection portion is covered with the case cover, excellent protection is also obtained.

In a case where the switching module further includes an insulating case cover covering the insulating layer, the cooling portion further includes an insulating frame member forming the fitting port, and the frame member is attached to the cooling portion to form the common mode current suppression structure, The inverter may include: outside the cooler, a first connection portion connected to the electrical conductive layer; outside the case cover, a second connection portion connected to the constant potential portion, the first connection portion and the second connection portion being connected to each other via a connector.

In this case, the conductive layer is provided in the cooling portion having no constant potential portion. The switching module having the constant potential portion and the conductive layer are provided in different members. The inverter may include: outside the cooler, a first connection portion connected to the electric conductive layer; outside the case cover, a second connection portion connected to the constant potential portion, the first connection portion and the second connection portion being connected to each other via a connector. Thus, even if the first connection portion and the second connection portion are connected to each other via the connector, the conductive layer and the constant potential portion can be easily connected to each other.

The refrigerant may be preferably cooling oil.

The cooling oil has much lower electric conductivity and relative permittivity than those of the cooling water. The common mode current can be effectively reduced by using the cooling oil as refrigerant. Accordingly, the common mode noise can be effectively suppressed. The common mode current suppression structure may further include an insulating partition member extending along the refrigerant flow path so as to divide a portion where the heat radiation portion and the cooler face each other via refrigerant, and the inverter may include a second electric conductive layer connected to the conductive layer may be embedded in the partition member.

Thus, the potential of the second electric conductive layer is kept constant. Consequently, there is no potential difference between the second electric conductive layer and the cooler. Accordingly, no charge is accumulated between the second electric conductive layer and the cooler. As a result, no common mode current substantially flows between the heat radiation portion and the cooler facing each other via the refrigerant.

Accordingly, no common mode current substantially flows. Thus, the common mode noise can be reduced to the extent possible. Thus, the switching control can be speeded up.

In this case, the refrigerant may be cooling water.

Since no common mode current substantially flows between the heat radiation portion and the cooler facing each other via the refrigerant, there is no problem even if the refrigerant is the cooling water. The cooling water is easily handleable and has excellent versatility.

Advantages of the Invention

According to the inverter to which the technique disclosed herein is applied, the common mode noise can be effectively suppressed with a relatively-simple structure. Thus, the inverter can be easily practically used, and the performance of the inverter can be improved at low cost.

DESCRIPTION OF EMBODIMENT

Hereinafter, embodiments of the technique disclosed herein will be described. It should be noted that the following description is merely illustrative in nature. An up-down direction used in the description is one example of a relative direction. Such a direction is not necessarily limited to up and down.

<Inverter>

Figure 1:
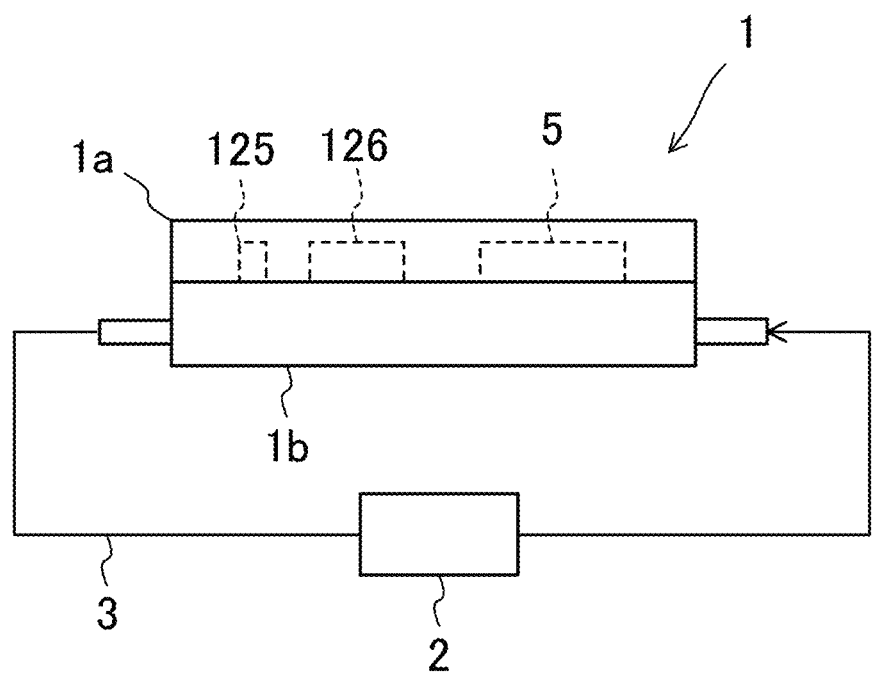
FIG. 1 is a schematic view of an inverter, to which the technique disclosed herein is directed.

FIG. 1 schematically illustrates an inverter 1, to which the technique disclosed herein is directed. The inverter 1 includes an electric component portion 1a for housing electronic components, and a cooling portion 1b for cooling the electronic components whose temperature increases during driving of the inverter 1. The electric component portion 1a and the cooling portion 1b are integrally formed.

The cooling portion 1b has a refrigerant inlet and a refrigerant outlet. The cooling portion 1b is connected to a cooling device 2, which is provided separately from the inverter 1, via each of the refrigerant inlet and outlet and a refrigerant circulation path 3. When the inverter 1 is driven, refrigerant cooled by the cooling device 2 is circulated and supplied to the cooling portion 1b via the refrigerant circulation path 3.

Various electronic components forming the inverter 1, such as a control circuit 126 and a smoothing capacitor 125 as described later, are housed in the electric component portion 1a. In the technique disclosed herein, part of these electronic components related to a switching module 5 forming an inverter circuit 104a is devised.

(Unimproved Module)

For the sake of easy understanding of the technique disclosed herein, a switching module 5 (unimproved module 100) before application of the technique disclosed herein will be described as a comparative example.

Figure 2:
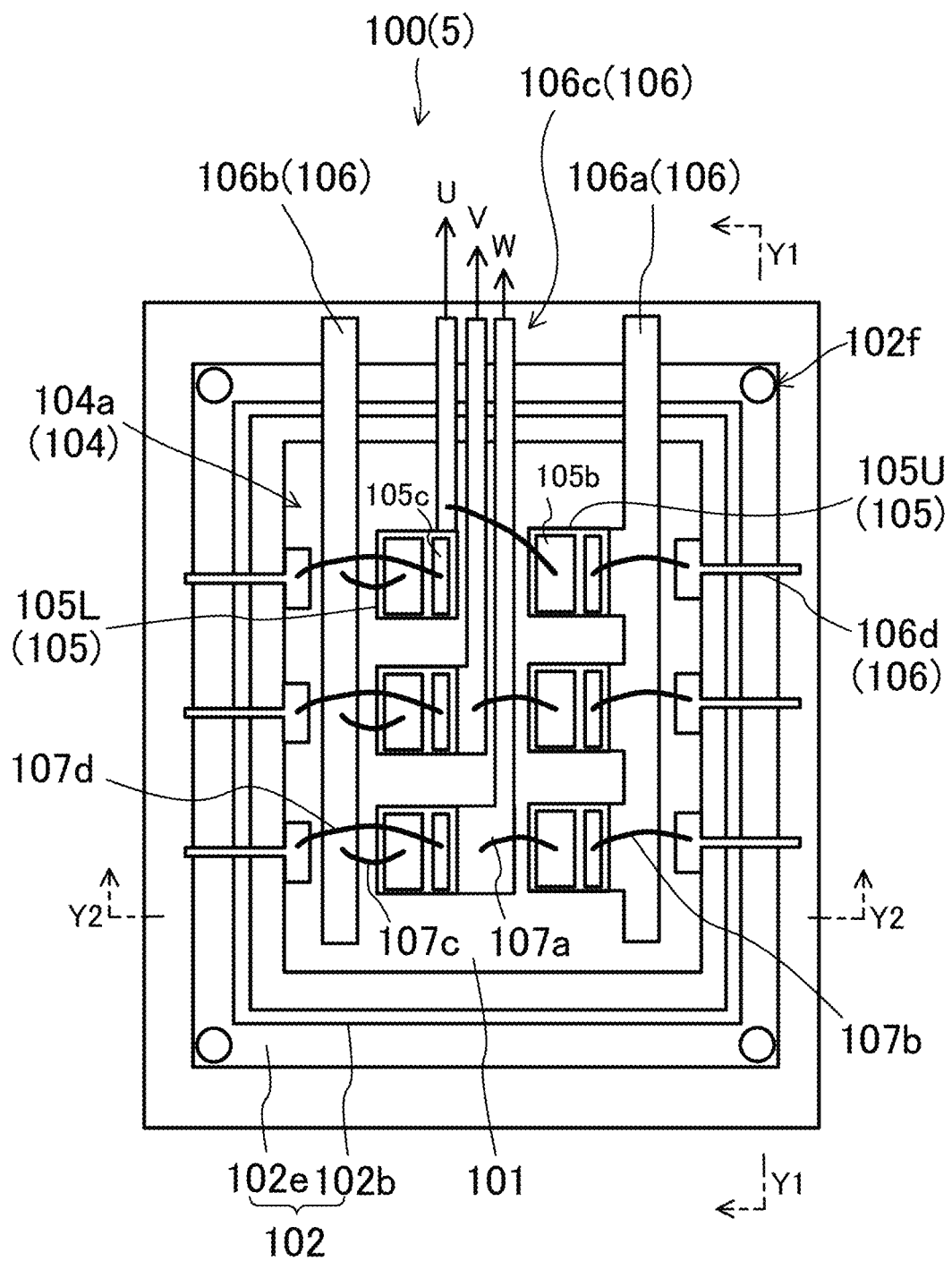
FIG. 2 is a schematic view (view from above) illustrating an unimproved module (comparative example).
Figure 3:
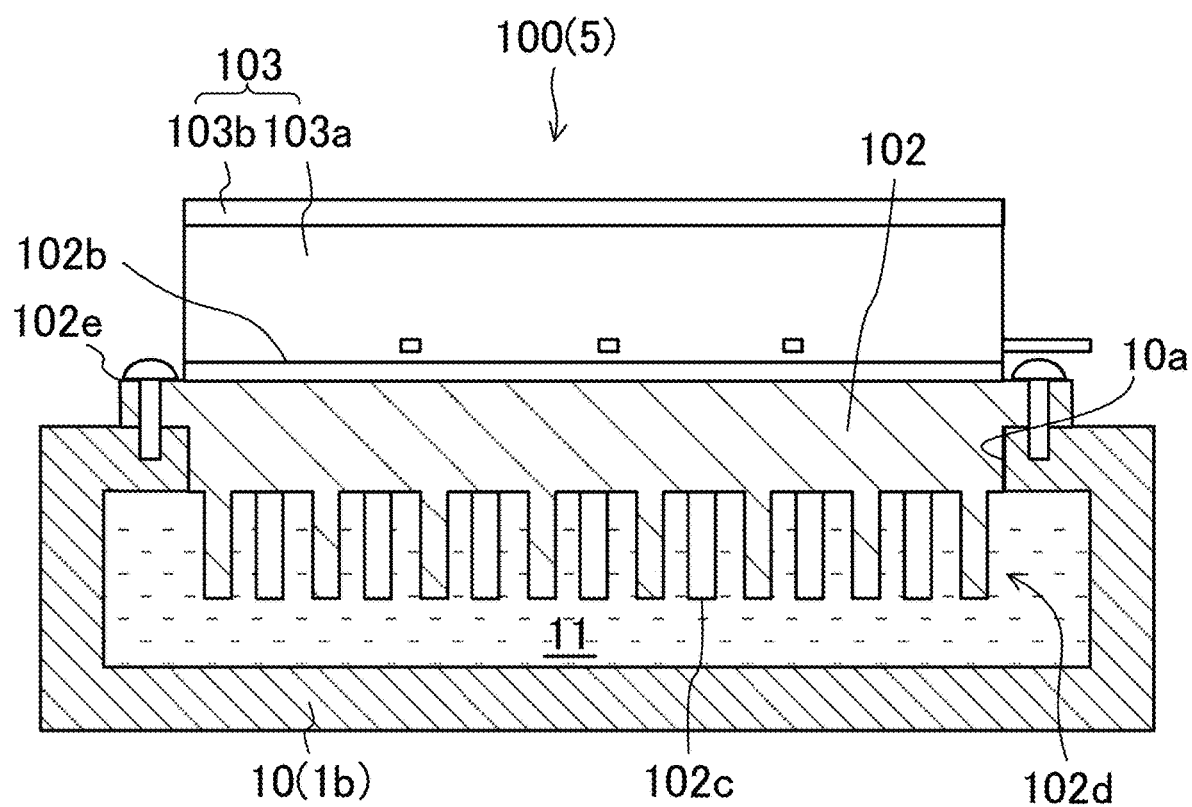
FIG. 3 is a schematic cross-sectional view taken along the arrow Y1-Y1 of FIG. 2.
Figure 4:
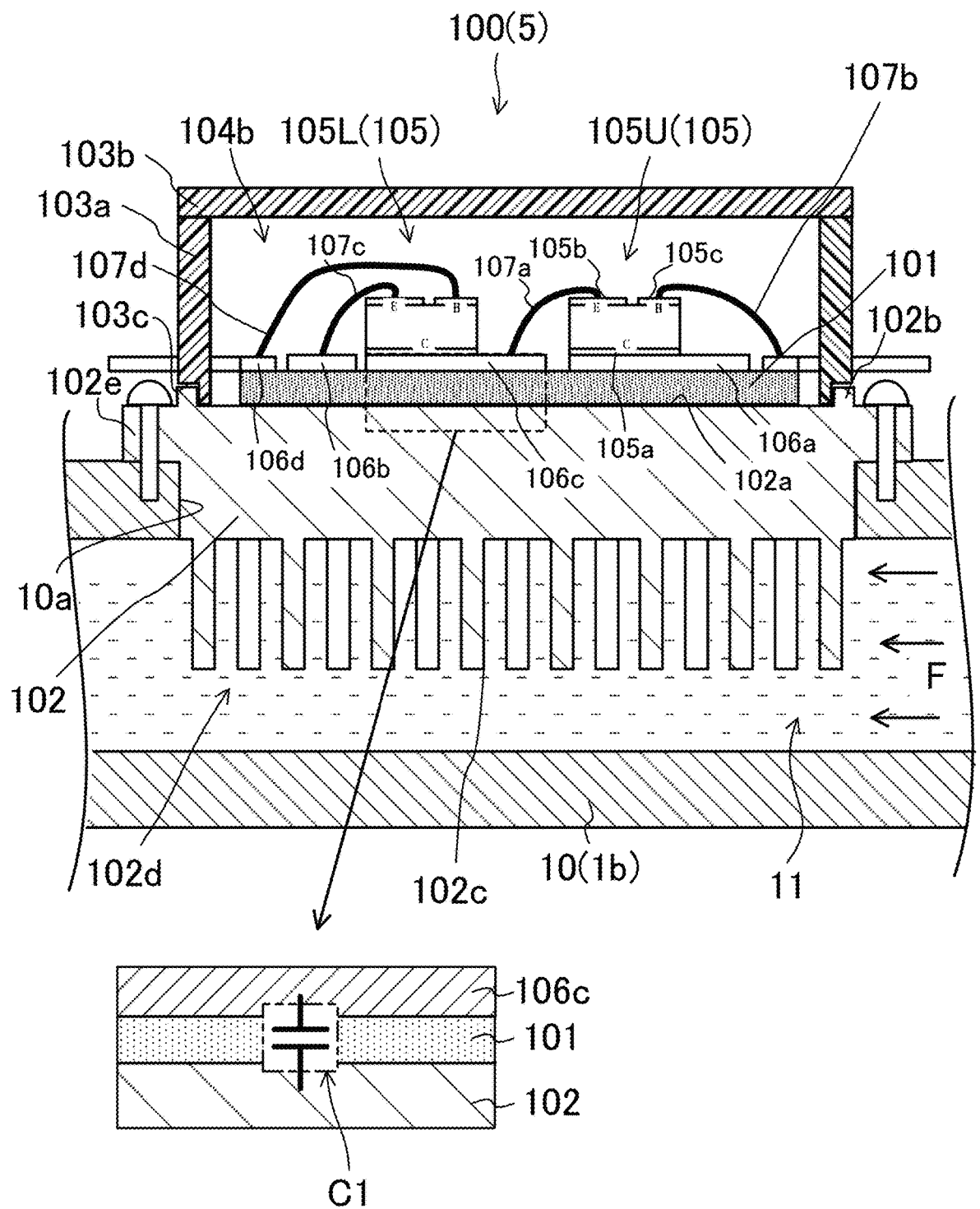
FIG. 4 is a schematic cross-sectional view taken along the arrow Y2-Y2 of FIG. 2.

FIG. 2 is a schematic view illustrating the inside of the unimproved module 100 viewed from above. FIG. 3 is a schematic view from a direction indicated by the arrow Y1-Y1 of FIG. 2. FIG. 4 is a schematic cross-sectional view taken along the arrow Y2-Y2 of FIG. 2.

As illustrated in FIGS. 2 to 4, the unimproved module 100 includes a substrate 101 (one example of an insulating layer) and a heat sink 102 joined to the lower surface of the substrate 101. The substrate 101 may be an insulating plate made of a ceramic sintered material.

The unimproved module 100 further includes a plastic (insulating) case cover 103 covering the substrate 101. The case cover 103 has a side frame portion 103a having a rectangular shape in top view and a lid portion 103b closing the upper opening of the side frame portion 103a. A fitting recessed portion 103c for installation is formed at the edge of the lower opening of the side frame portion 103a facing the lid portion 103b.

Although not illustrated, the inside of the case cover 103 is filled with insulating resin.

The heat sink 102 is formed in a rectangular shape in top view from aluminum alloy. The material of the heat sink 102 is not limited to aluminum alloy as long as the material has excellent thermal conductivity and electrical conductivity. A flat heat receiving portion 102a is provided on an upper portion of the heat sink 102.

At the periphery of the heat receiving portion 102a, a frame-shaped fitting raised portion 102b fitted in the fitting recessed portion 103c of the case cover 103 is provided. The side frame portion 103a of the case cover 103 is fixed to the heat sink 102 by fitting of the fitting raised portion 102b in the fitting recessed portion 103c. At a lower portion of the heat sink 102, a heat radiation portion 102d including a great number of pin-shaped heat radiation protrusions 102c is provided.

A flange portion 102e projects from the heat sink 102 circumferentially. Fastening portions 102f for pinning are provided at four corners of the flange portion 102e.

As illustrated in FIGS. 3 and 4, the cooling portion 1b includes a cooler 10. The cooler is made of aluminum alloy as in the heat sink 102.

A refrigerant flow path 11 in which refrigerant flows in a direction indicated by the arrow F in FIG. 4 is formed inside the cooler 10. A rectangular fitting port 10a communicating with the refrigerant flow path 11 is provided at an upper portion of the cooler 10.

The heat sink 102 is fitted in the fitting port 10a such that the heat radiation portion 102d is exposed to the inside of the cooler 10 through the fitting port 10a. The periphery of the fitting port 10a is sealed in order to prevent liquid leakage. By pinning each fastening portion 102f, the heat sink 102 is attached to the cooler 10.

An electronic circuit 104 including the inverter circuit 104a is provided on the upper surface of the substrate 101. More specifically, the inverter circuit 104a includes three half-bridge circuits 104b, each of which includes two switching elements 105 (semiconductor chip, upper arm chip 105U and lower arm chip 105L) connected in series. These half-bridge circuits 104b each correspond to U, V, and W phases output from the inverter 1.

Here, the switching elements 105 are IGBTs. The character "C" in FIG. 4 indicates a collector electrode 105a (first electrode), and the character "E" indicates an emitter electrode 105b (second electrode). The character "B" indicates a base electrode 105c (third electrode). Although a free wheel diode is connected in anti-parallel with each switching element 105 (see FIG. 5), illustration thereof is omitted.

On the upper surface of the substrate 101, an electrode conductor 106 having a predetermined pattern is provided. Using the electrode conductor 106, the electronic circuit 104 corresponding to electric wiring of the inverter circuit 104a is provided.

More specifically, as illustrated in FIG. 2, the electrode conductor 106 includes a positive-side line terminal portion 106a forming a positive-side line 123H, a negative-side line terminal portion 106b forming a negative-side line 123L, three output line terminal portions 106c forming output lines 124 respectively corresponding to the U, V, and W phases, and six switching terminal portions 106d forming switching terminals connected to the base electrodes 105c of the semiconductor chips.

The emitter electrode 105b and the base electrode 105c are provided on the upper surfaces of the switching elements 105. The emitter electrode 105b is greater in area than the base electrode 105c used for control.

Each upper arm chip 105U is soldered to a predetermined location on the positive-side line terminal portion 106a. Accordingly, the collector electrode 105a of each upper arm chip 105U is connected to the positive-side line 123H.

The emitter electrode 105b of each upper arm chip 105U is connected to the output line terminal portion 106c of the same phase via a bonding wire 107a. Accordingly, the emitter electrode 105b of each upper arm chip 105U is connected to the output line 124. The base electrode 105c of each upper arm chip 105U is connected to the switching terminal portion 106d via a bonding wire 107b.

Each lower arm chip 105L is soldered to a predetermined location on the output line terminal portion 106c of a corresponding one of the phases. Accordingly, the collector electrode 105a of each lower arm chip 105L is connected to the output line 124 of a corresponding one of the phases.

The emitter electrode 105b of each lower arm chip 105L is connected to the negative-side line terminal portion 106b via a bonding wire 107c. The base electrode 105c of each lower arm chip 105L is connected to the switching terminal portion 106d via a bonding wire 107b. Each switching terminal portion 106d is provided to switch whether to flow current in a current path between the collector electrode 105a and the emitter electrode 105b.

A structure capable of accumulating charge, i.e., a structure in which two electrical conductors face each other via an insulating material (dielectric), is formed between the output line terminal portion 106c (in particular, a portion of the lower arm chip 105L joined to the collector electrode 105a) and the heat sink 102. The voltage of the output line terminal portion 106c is intermittently changed by switching control. This structure allows a predetermined stray capacitance to be generated at this portion (for the sake of easy explanation, it is assumed that a virtual capacitor C is formed at the portion where the stray capacitance would be generated).

Accordingly, as illustrated in FIG. 4 in close-up, a virtual capacitor C (first virtual capacitor C1) where a predetermined stray capacitance would be generated is formed at this portion.

Figure 5:
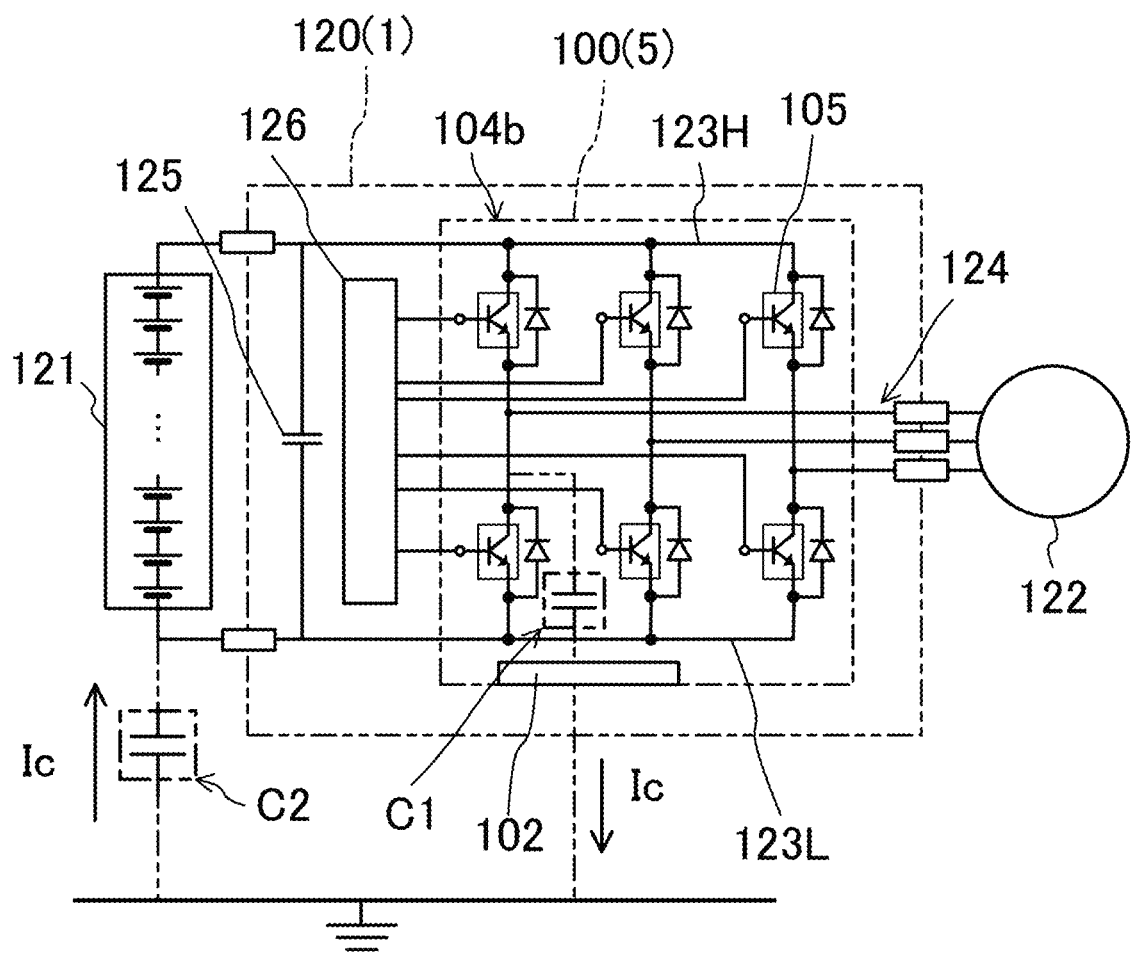
FIG. 5 is a circuit diagram of an unimproved inverter equipped with the unimproved module.

FIG. 5 illustrates an example of the configuration of the in-vehicle inverter 1 (unimproved inverter 120) equipped with the unimproved module 100. The unimproved inverter 120 is installed between a high-voltage battery 121 for motor-driving and a drive motor 122 (AC motor, generally permanent magnet synchronous motor) for vehicle-driving. The unimproved inverter 120 has the positive-side line 123H, the negative-side line 123L, and the output lines 124 described above. The positive-side line 123H is connected to the positive electrode terminal of the high-voltage battery 121, and the negative-side line 123L is connected to the negative electrode terminal of the high-voltage battery 121.

The three half-bridge circuits 104b are bridged in parallel between the positive-side line 123H and the negative-side line 123L positioned on the output side of the unimproved inverter 120. The smoothing capacitor 125 is bridged between the positive-side line 123H and the negative-side line 123L positioned on the input side of the unimproved inverter 120.

The unimproved inverter 120 includes a control circuit 126 that performs the switching control. The control circuit 126 is connected to the base electrodes 105c of the respective switching elements 105 of the unimproved module 100. The unimproved inverter 120 turns on and off the switching elements 105 at a predetermined drive frequency (for example, 10 kHz), converts DC power supplied from the high-voltage battery 121 into three-phase AC power of U, V, and W phases, and supplies the AC power to the drive motor 122.

The heat sink 102 is grounded by being connected to a metallic portion of a vehicle body via the cooler 10. Accordingly, the first virtual capacitor C1 is formed between the output line terminal portion 106c (in particular, a portion of the lower arm chip 105L of each phase joined to the collector electrode 105a) and the heat sink 102, as described above. Since the high-voltage battery 121 is in a floating state, a virtual capacitor C (second virtual capacitor C2) having a certain stray capacitance is present between the high-voltage battery 121 and the ground.

When the unimproved inverter 120 operates, rectangular-waved high voltage including a harmonic component is applied (to a midpoint) between the upper arm chip 105U and the lower arm chip 105L in each half-bridge circuit 104b. Accordingly, common mode current flows via a current path passing through the first virtual capacitor C1 and the second virtual capacitor C2, as indicated by an arrow Ic in FIG. 5. As a result, common mode noise occurs.

The rated voltage of the high-voltage battery 121 is, for example, a high voltage of 40 V or more or 100 V or more. Thus, in this case, a voltage change caused is great, and consequently the common mode current and common mode noise are also great. Thus, due to the common mode noise, there is a limitation on speeding-up of the switching control.

(Improved Module, Improved Inverter 1)

Figure 6:
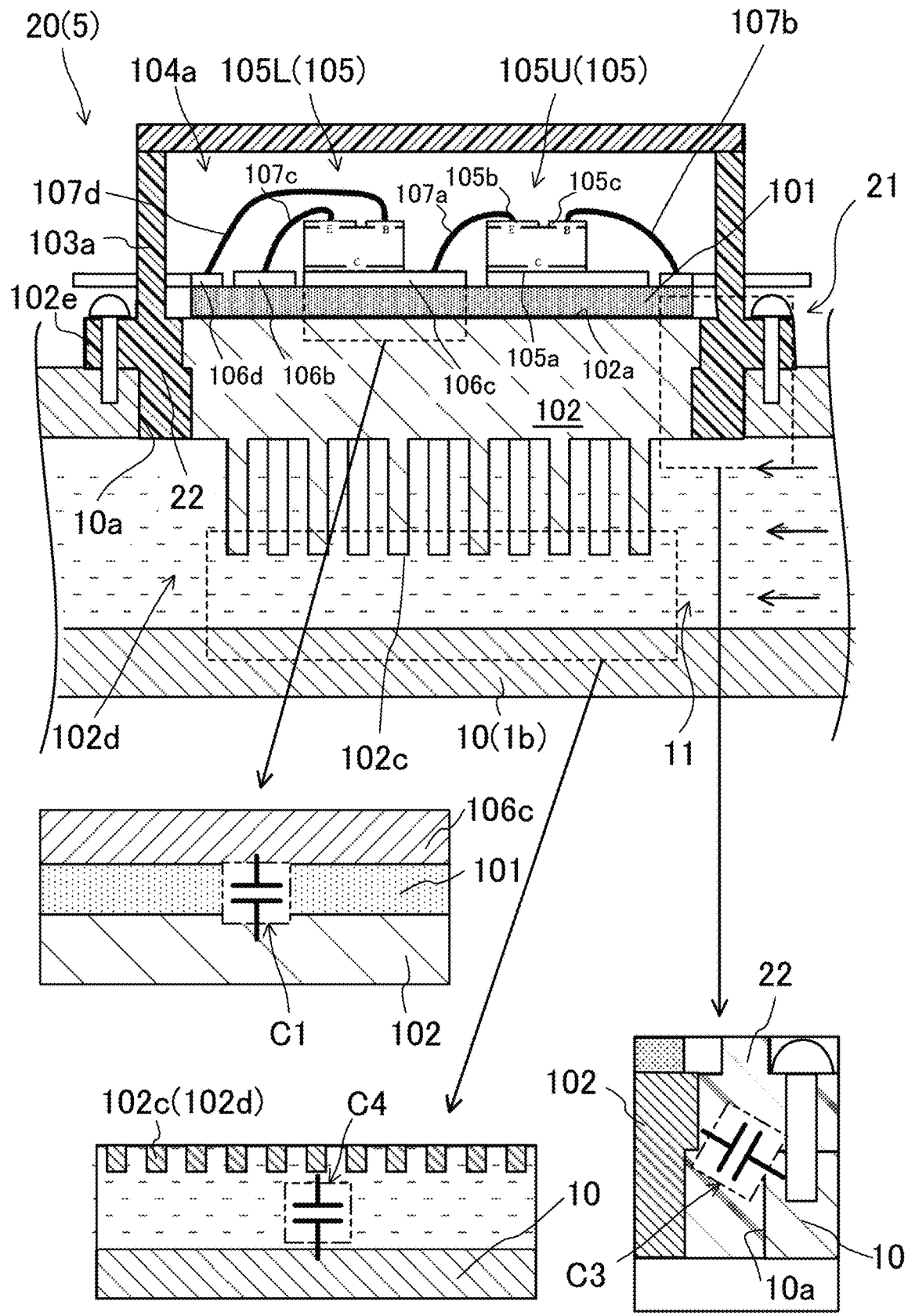
FIG. 6 is a schematic view illustrating an improved module (embodiment), FIG. 6 corresponding to FIG. 4.
Figure 7:
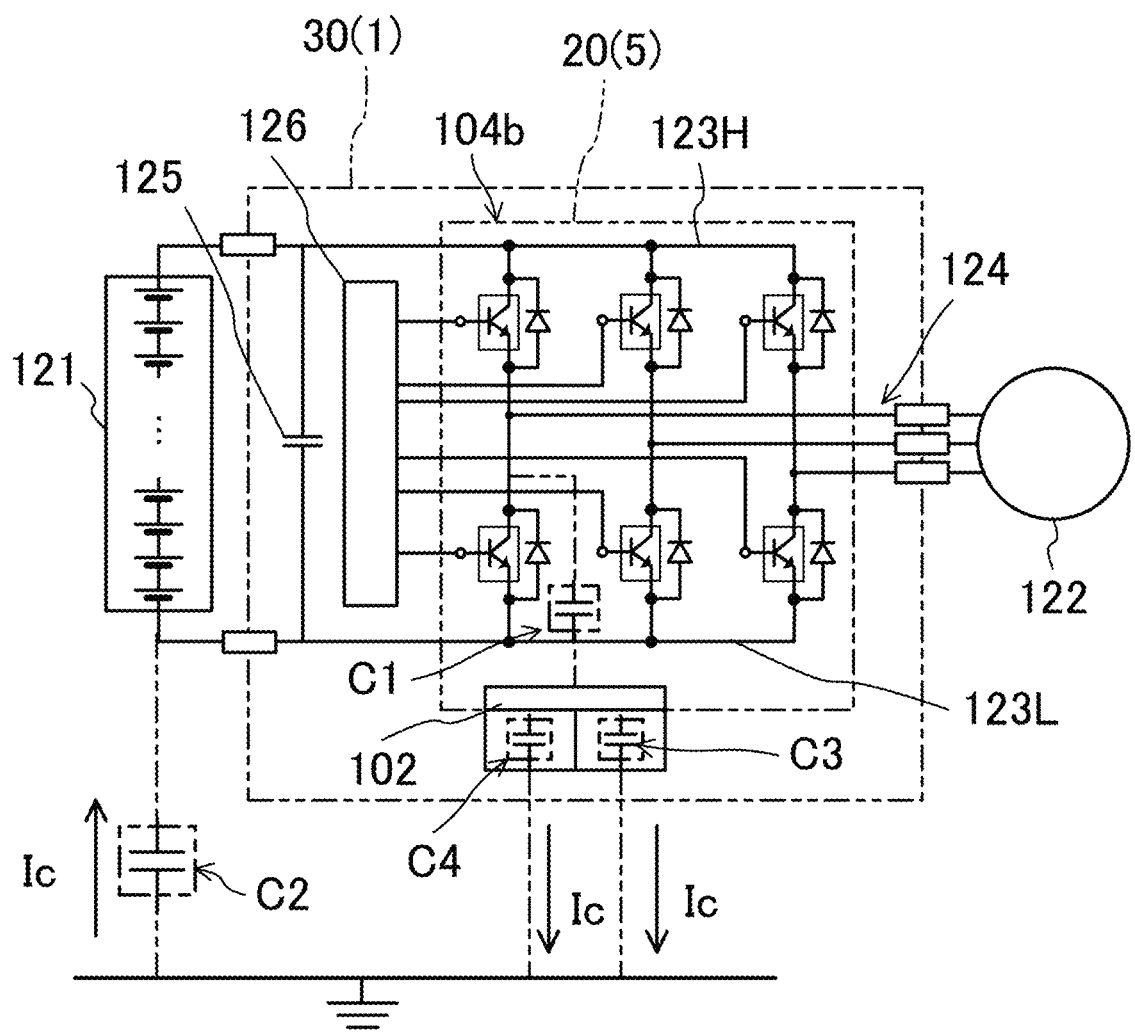
FIG. 7 is a circuit diagram of an improved inverter equipped with the improved module.

FIG. 6 illustrates an example of a switching module 5 (improved module 20) to which the technique disclosed herein is applied. FIG. 6 is a view corresponding to FIG. 4. Since the top view of the improved module 20 is the same as FIG. 2, illustration thereof is omitted (the same also applies to a view in a direction indicated by the arrow Y1-Y1 of FIG. 2). FIG. 7 illustrates an example of an in-vehicle inverter 1 (improved inverter 30) equipped with the improved module 20.

A basic structure of the improved module 20 is the same as that of the unimproved module 100. A basic structure of the improved inverter 30 is the same as that of the unimproved inverter 120 shown in FIG. 5. Thus, the like reference numerals are used to represent components having the like configurations, and the description thereof will be simplified or omitted (the same applies to modifications, applications, etc. below).

The improved module 20 is different from the unimproved module 100 in that a structure according to the present disclosure (common mode current suppression structure 21) including an insulating member is interposed between the heat sink 102 and the cooler 10 to electrically insulate the heat sink 102 and the cooler 10 from each other.

More specifically, as illustrated in FIG. 6, in the improved module 20, the lower side of the side frame portion 103a of the case cover 103 protrudes to form a fitting portion 22 to be fitted in the fitting port 10a. The heat sink 102 is fixed to the case cover 103 by being fitted inside the fitting portion 22.

In the improved inverter 30, the fitting portion 22, which is the end portion of the case cover 103 is fitted in the fitting port 10a to form the common mode current suppression structure 21. That is, in the improved inverter 30, the heat sink 102 and the cooler 10 are electrically insulated from each other by the fitting portion 22.

Thus, as illustrated in FIG. 6 in close-up, in the improved module 20, virtual capacitors C (third virtual capacitor C3 and fourth virtual capacitor C4) where a certain stray capacitance would be generated are formed between the outer periphery of the heat sink 102 and the inner periphery of the fitting port 10a facing each other and between the heat radiation portion 102d of the heat sink 102 (more specifically, the protruding end of each heat radiation protrusion 102c) and the inner surface of the cooler 10 facing each other via refrigerant, in addition to the first virtual capacitor C1 described above.

Accordingly, the first virtual capacitor C1 is connected in series with each of the third virtual capacitor C3 and the fourth virtual capacitor C4, as illustrated in FIG. 7.

In this case, the stray capacitance which would be generated by the first virtual capacitor C1, the third virtual capacitor C3, and the fourth virtual capacitor C4 is smaller than the stray capacitance which would be generated by the first virtual capacitor C1 of the unimproved module 100.

Thus, since the common mode current is reduced, the common mode noise can be suppressed.

The dielectric of the fourth virtual capacitor C4 is made of refrigerant. Generally, cooling water is often used as refrigerant. However, the cooling water has relatively-high electrical conductivity and relative permittivity. Thus, in a case where the cooling water is used as refrigerant, the stray capacitance of the fourth virtual capacitor C4 is high, and an effect of suppressing the common mode current is reduced.

For this reason, cooling oil (e.g., transformer cooling oil or hydraulic oil) may be preferably used as refrigerant. The cooling oil has much lower electric conductivity and relative permittivity than those of the cooling water. The common mode current can be effectively reduced by using the cooling oil as refrigerant. Accordingly, the common mode noise can be effectively suppressed.

(Modification of Improved Inverter)

Figure 8:
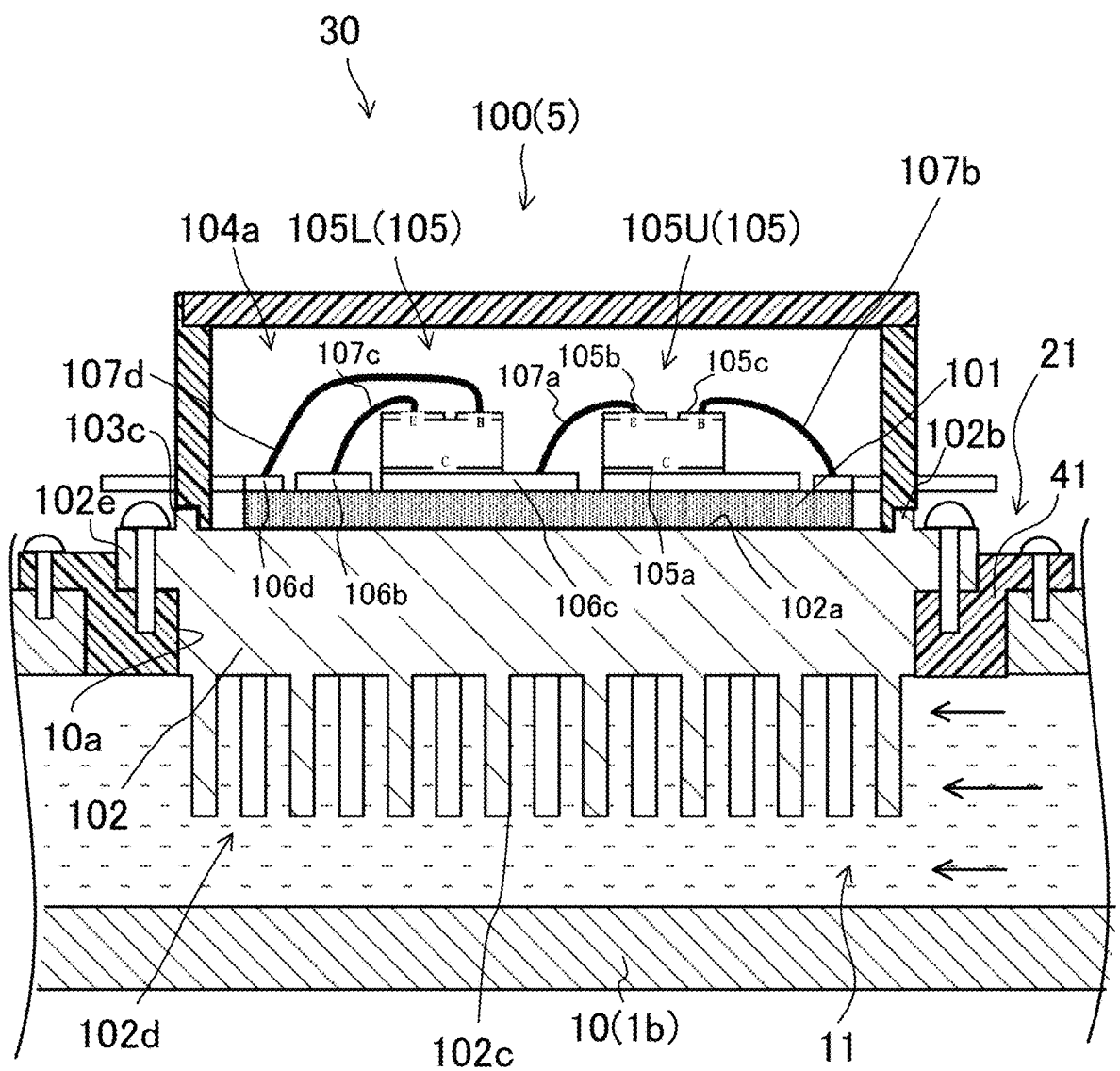
FIG. 8 is a view for describing a modification of the improved inverter.

FIG. 8 illustrates a modification of the improved inverter 30. In the improved inverter 30, the common mode current suppression structure 21 is formed by modifying the structure of the switching module 5.

On the other hand, in this modification, the common mode current suppression structure 21 is formed by modifying the structure of the cooler 10. Thus, in the case of this modification, the existing switching module 5 (unimproved module 100) can be employed. A basic structure of this modification is the same as that of the improved inverter 30.

As shown in FIG. 8, in this modification, the cooling portion 1b further includes a plastic (insulating) frame member 41 forming the fitting port 10a. The fitting port 10a is provided inside the frame member 41. The frame member 41 is sealingly attached to the cooler in order to prevent liquid leakage.

In this modification, the heat sink 102 and the cooler 10 are electrically insulated from each other by the frame member 41.

Thus, also in this modification, features and advantages similar to those of the improved inverter 30 are obtained.

<Applications of Improved Inverter>
(First Applied Inverter)

Figure 9:
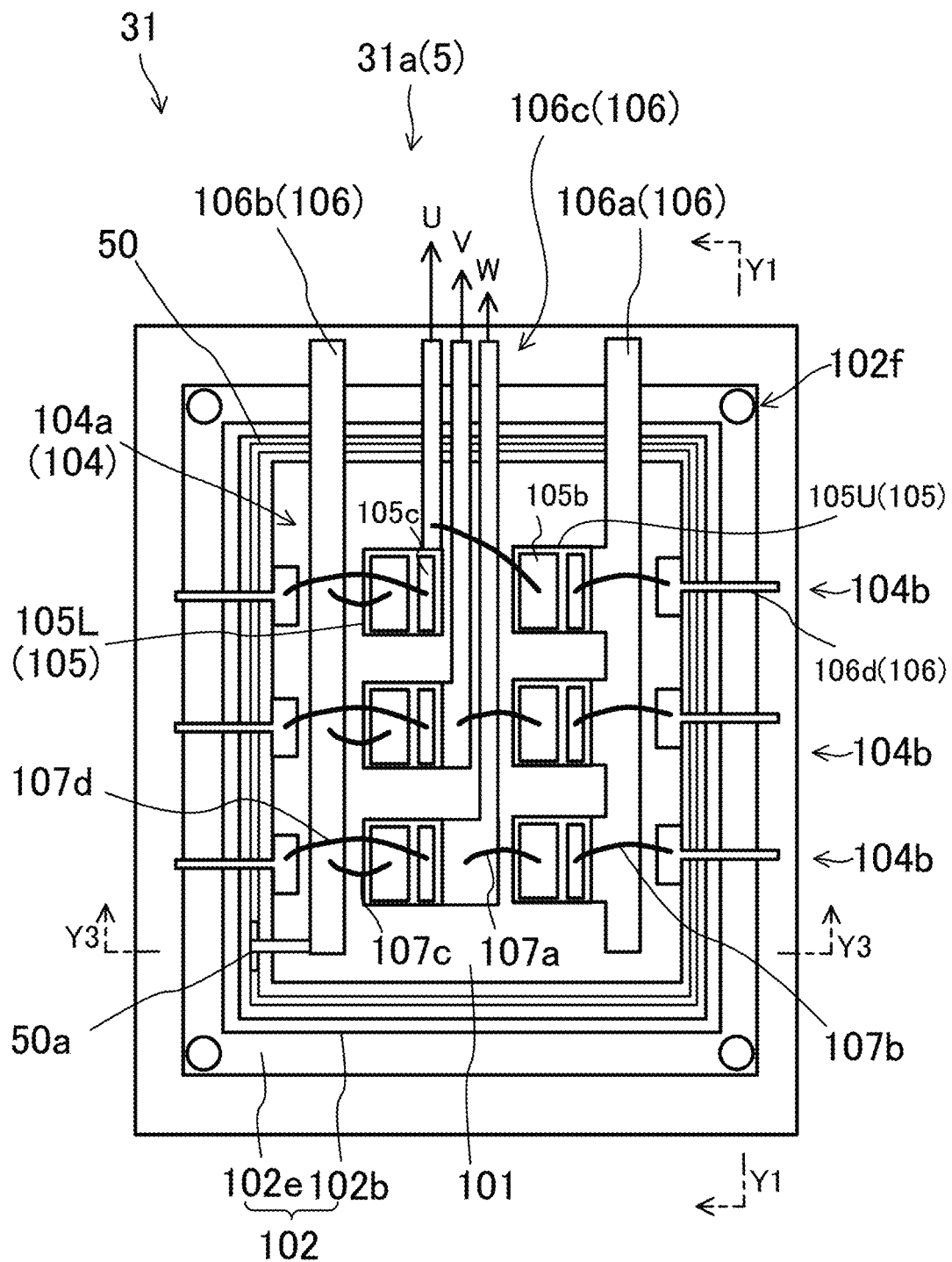
FIG. 9 is a view for describing an application (first applied inverter) of the improved inverter, FIG. 9 illustrating a first applied module (view from above).
Figure 10:
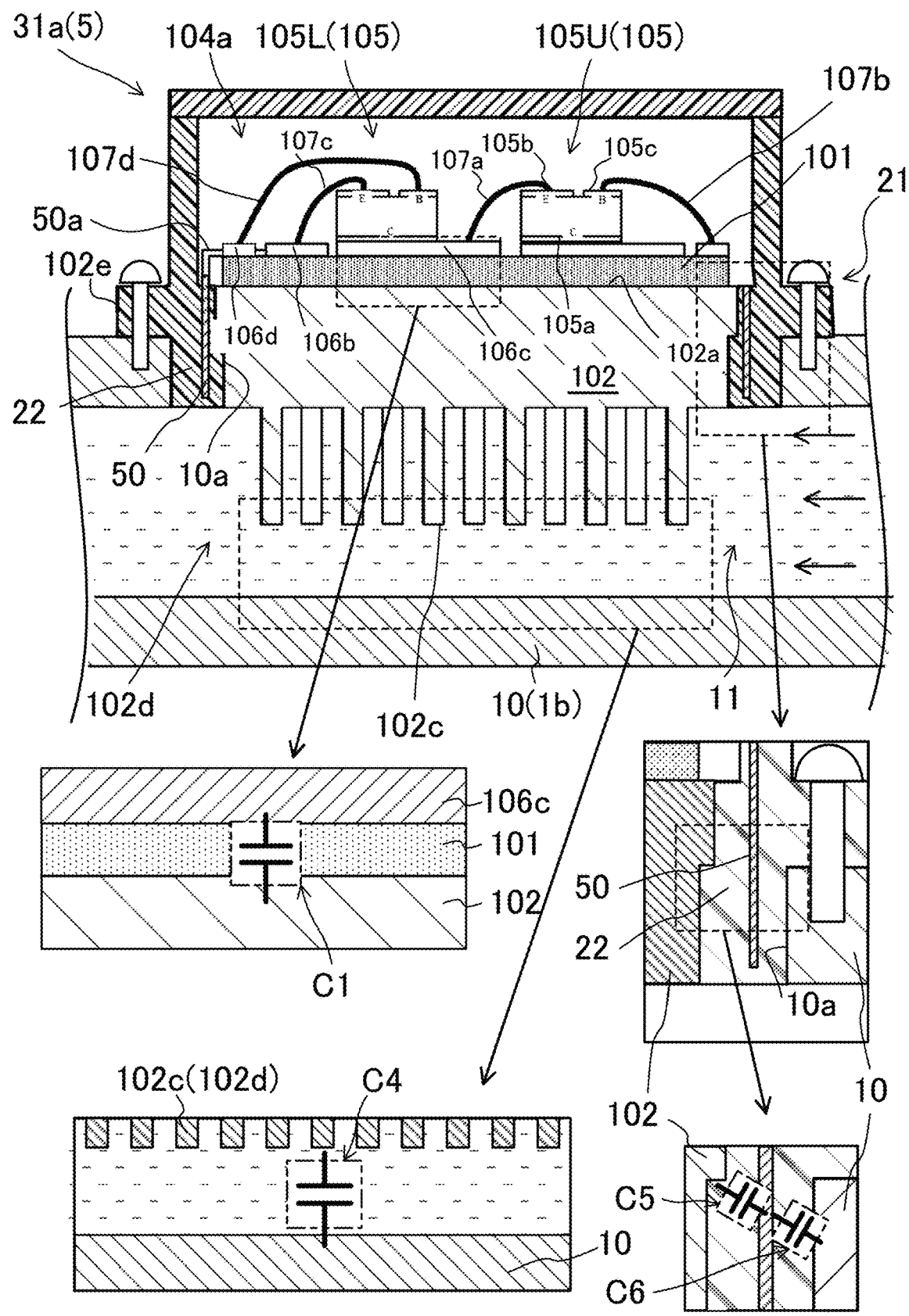
FIG. 10 is a schematic cross-sectional view taken along the arrow Y3-Y3 of FIG. 9.
Figure 11:
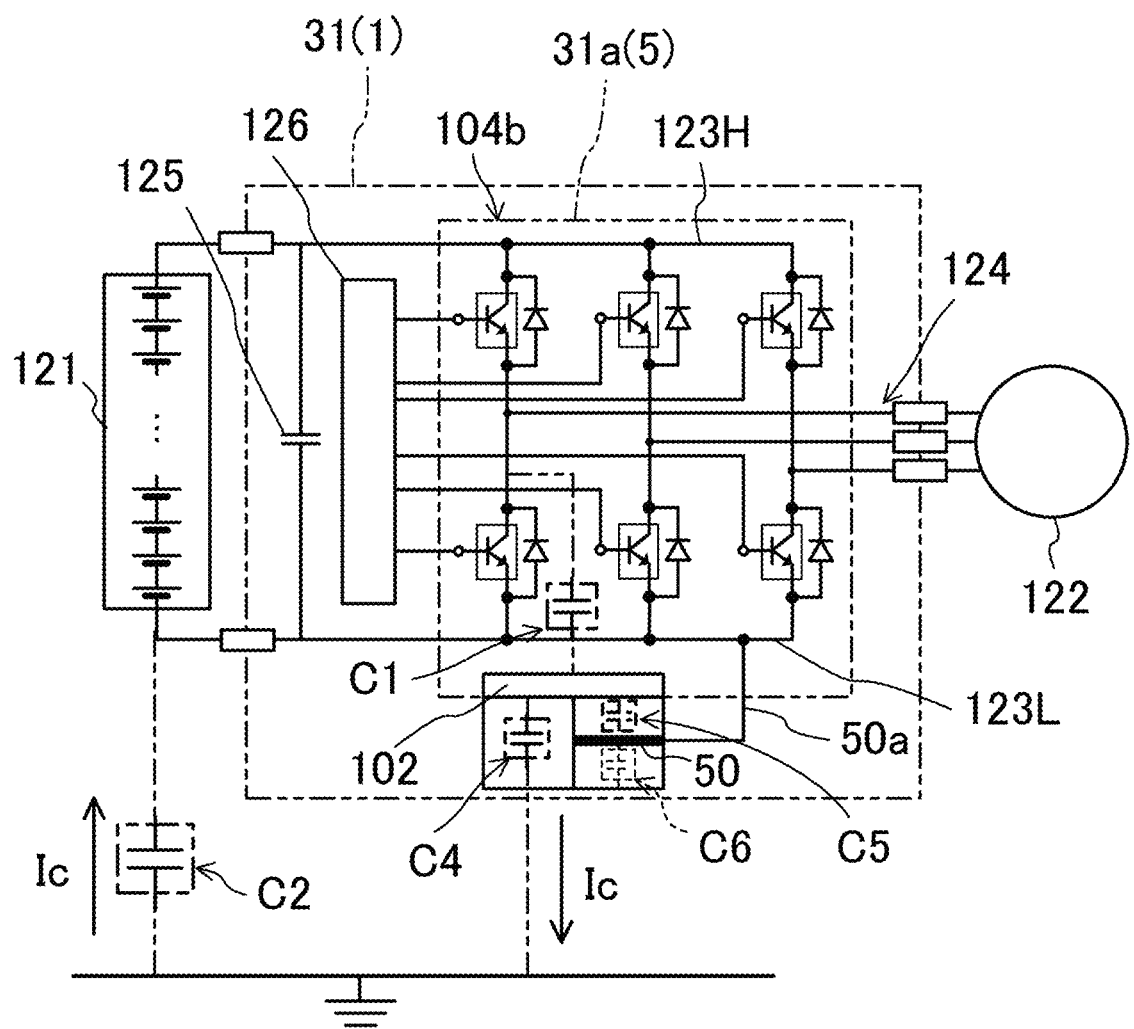
FIG. 11 is a circuit diagram of the first applied inverter.

FIGS. 9 to 11 illustrate an application (first applied inverter 31) of the improved inverter 30. FIG. 9 is a schematic view illustrating the inside of the switching module 5 (first applied module 31a) viewed from above. FIG. 10 is a schematic cross-sectional view taken along the arrow Y3-Y3 of FIG. 9. FIG. 11 is a schematic diagram illustrating the configuration of the first applied inverter 31.

The first applied module 31a is different from the improved module 20 in that an electric conductive layer 50 according to the present disclosure is provided in the common mode current suppression structure 21.

More specifically, as illustrated in FIGS. 9 and 10, the frame-shaped electric conductive layer 50 extending along the periphery of the heat sink 102 is embedded in the fitting portion 22 forming the common mode current suppression structure 21. The electric conductive layer 50 may be formed of, e.g., a copper plate or copper foil. The periphery of the electric conductive layer 50 is insulated by being covered with plastic.

Thus, the opposing portions of the heat sink 102 and the cooler 10 are divided by the electric conductive layer 50 electrically insulatively from each other. Accordingly, as illustrated in FIG. 10 in close-up, the third virtual capacitor C3 is divided into two virtual capacitors C connected in series.

That is, the third virtual capacitor C3 is divided into a fifth virtual capacitor C5 formed between the heat sink 102 and the electric conductive layer 50 and a sixth virtual capacitor C6 formed between the electric conductive layer 50 and the cooler 10.

As illustrated in FIGS. 9 and 10, the electric conductive layer 50 has a connection end portion 50a projecting into the case cover 103. The electric conductive layer 50 is electrically connected to the negative-side line terminal portion 106b via the connection end portion 50a.

The negative-side line terminal portion 106b is a portion of the negative-side line 123L in the inverter circuit 104a. As schematically illustrated in FIG. 11, the electric conductive layer 50 is connected to the negative-side line 123L via the connection end portion 50a.

Thus, the potential of the electric conductive layer 50 is the same as the potential of the negative electrode of the high-voltage battery 121. Even when the switching element 105 of the lower arm chip 105L is turned on and off by the switching control, charging and discharging are carried out in the fifth virtual capacitor C5 accordingly thereto. Thus, there is no potential difference between the opposing portions of the heat sink 102 and the electric conductive layer 50. Therefore, no charge is accumulated in the sixth virtual capacitor C6.

Thus, no common mode current flows in a current path passing through the fifth virtual capacitor C5 and the sixth virtual capacitor C6. The common mode current flows in a current path passing through the first virtual capacitor C1 and the fourth virtual capacitor C4 connected in series. The stray capacitance of the first virtual capacitor C1 and the fourth virtual capacitor C4 connected in series is much lower than the stray capacitance which would be generated in the improved inverter 30.

Thus, since the common mode current is further reduced, the common mode noise can be further suppressed.

(Constant Potential Portion)

In the above-described first applied module 31a, the portion of the negative-side line 123L, more specifically the negative-side line terminal portion 106b (the emitter electrode 105b of the lower arm chip 105L of each phase) of each phase, is a "constant potential portion." However, it is sufficient that the electric conductive layer 50 is connected to a portion where the potential does not change even when the switching control is performed, and the constant potential portion is not limited to the portion of the negative-side line 123L.

Figure 12:
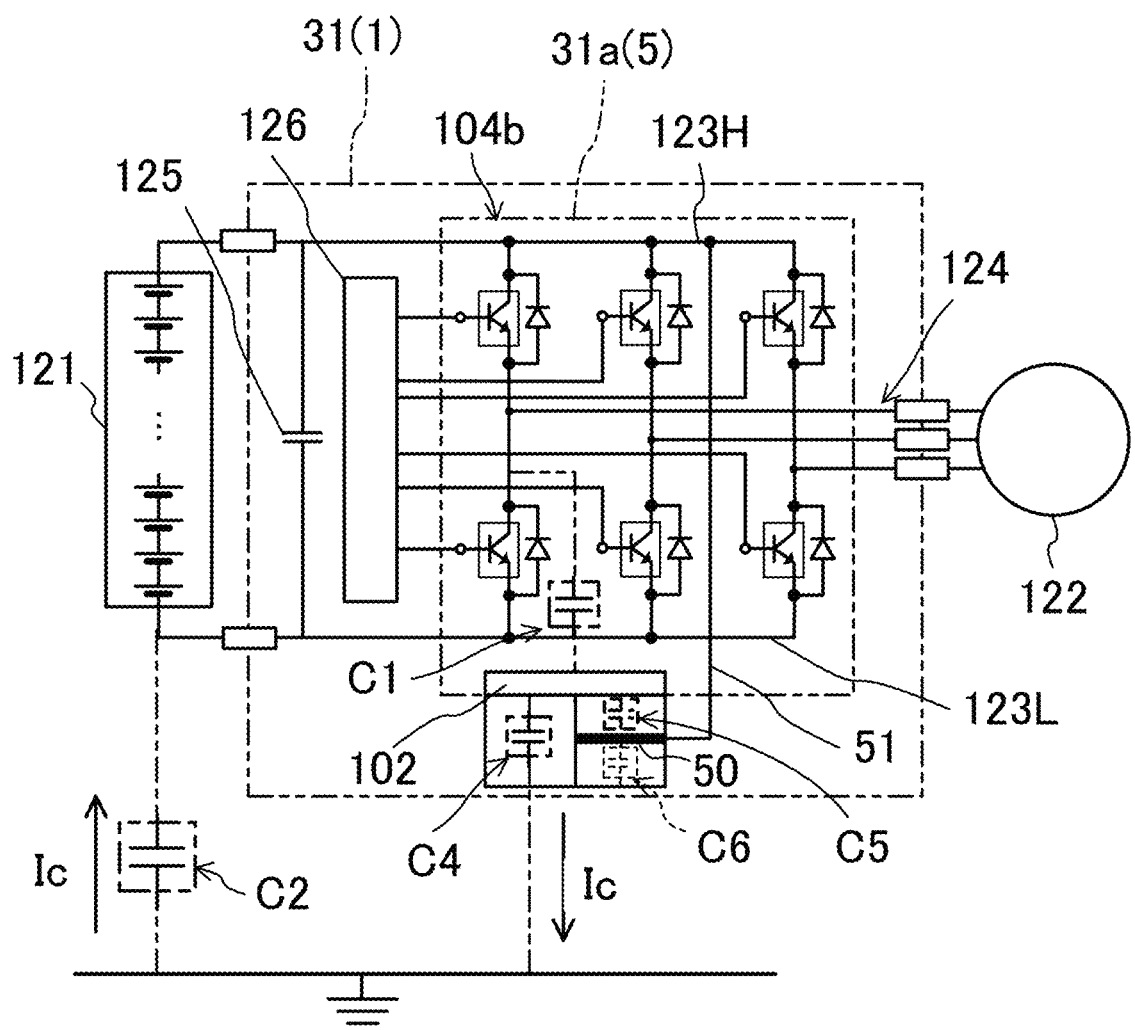
FIG. 12 is a view for describing a modification of a constant potential portion.

Thus, as illustrated in FIG. 12, the electric conductive layer 50 may be connected not to the negative-side line terminal portion 106b, but to the positive-side line terminal portion 106a (the collector electrode 105a of the upper arm chip 105U of each phase) of each phase which is a portion of a high-voltage line (see a first line 51 in FIG. 12). Thus, a portion of the positive-side line 123H may be configured as the "constant potential portion."

In this case, the electric conductive layer 50 is held at the potential of the positive electrode side of the high-voltage battery 121 regardless of whether the first applied module 31a is turned on or off. Thus, there is no potential difference between the heat sink 102 and the electric conductive layer 50 regardless of whether the first applied module 31a is turned on or off. Due to the charging and discharging in the fifth virtual capacitor C5, no charge is accumulated in the sixth virtual capacitor C6. Thus, no common mode current flows in the current path passing through the fifth virtual capacitor C5 and the sixth virtual capacitor C6.

Figure 13:
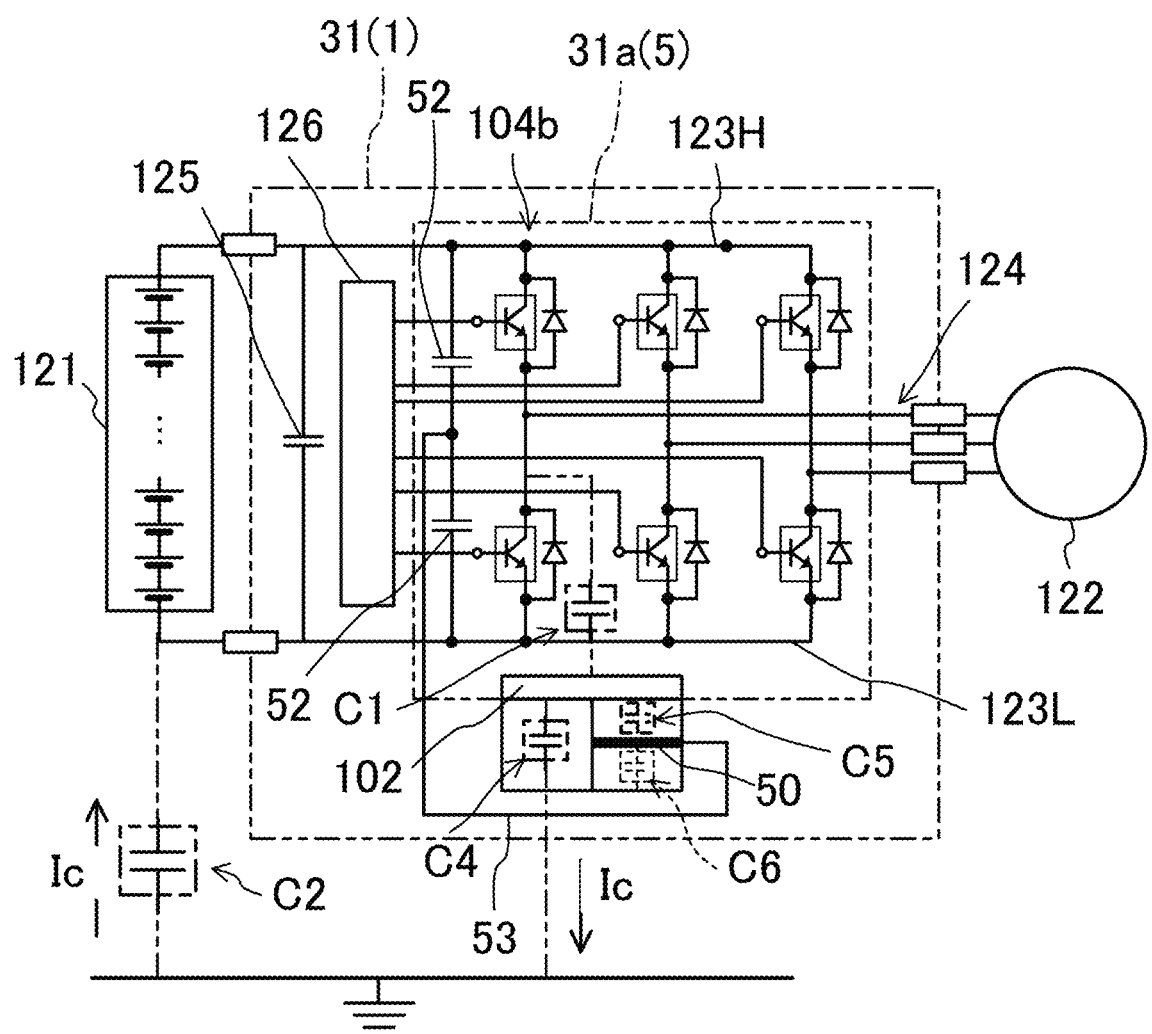
FIG. 13 is a view for describing a modification of the constant potential portion.

Further, as illustrated in FIG. 13, the structure is also applicable to a case where the inverter 1, to which the technique disclosed herein is directed, includes two capacitors 52, 52 connected in series between the positive-side line 123H and the negative-side line 123L. That is, a predetermined voltage value lower than the voltage of the high-voltage battery 121 is held at a portion between these two capacitors 52, 52.

Thus, the portion between the two capacitors 52,52 may be the "constant potential portion," and the electric conductive layer 50 may be connected thereto (see a second line 53 in FIG. 13).

In this case, the electric conductive layer 50 is held at a predetermined potential lower than the voltage of the high-voltage battery 121 regardless of whether the first applied module 31a is turned on or off. Thus, also in this case, there is no potential difference between the electric conductive layer 50 and the heat sink 102. Due to the charging and discharging in the fifth virtual capacitor C5, no charge is accumulated in the sixth virtual capacitor C6. Thus, no common mode current flows in the current path passing through the fifth virtual capacitor C5 and the sixth virtual capacitor C6.

(Modification of First Applied Inverter)

Figure 14:
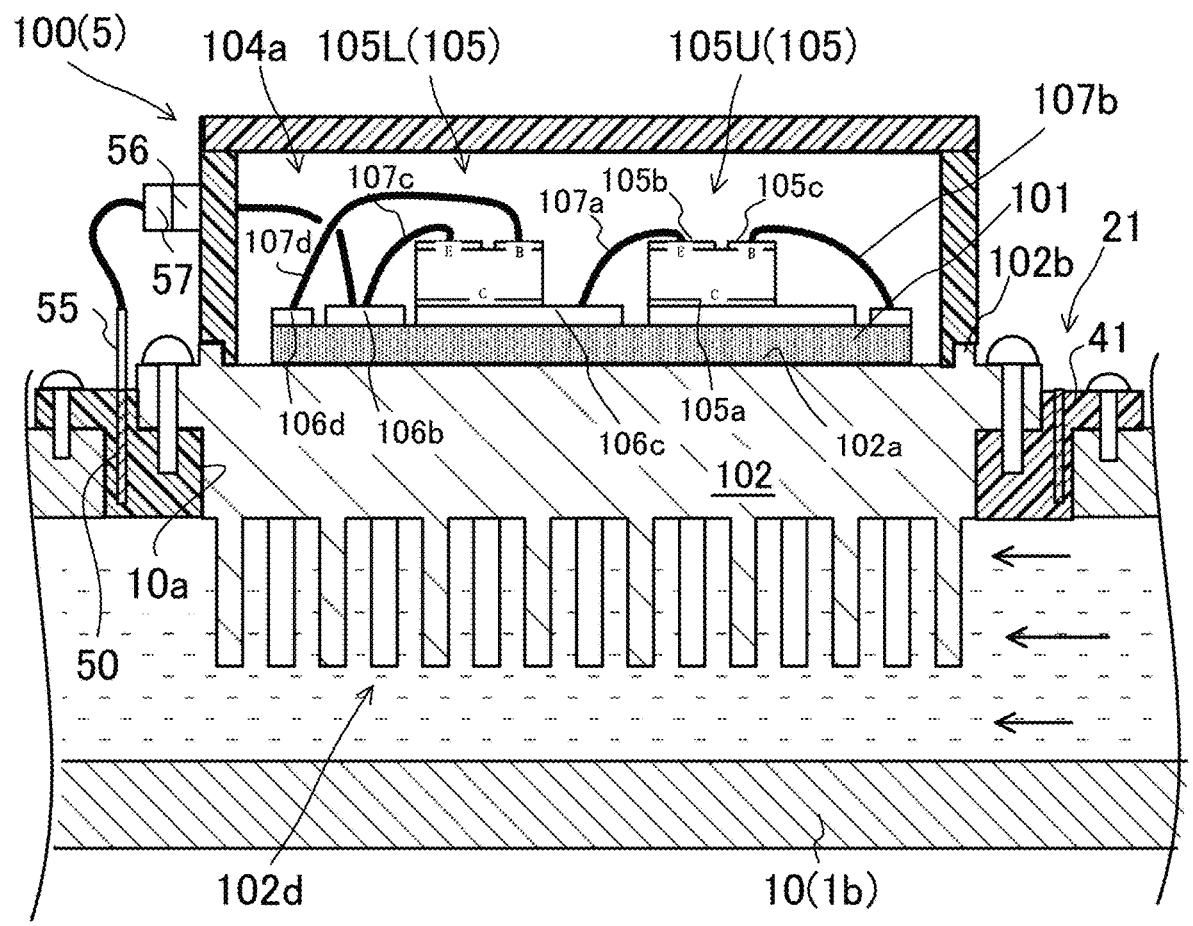
FIG. 14 is a view for describing a modification of the first applied inverter.

FIG. 14 illustrates a modification of the first applied inverter 31. In this modification, the common mode current suppression structure 21 is formed by modifying the structure of the cooler 10, as in the improved inverter 30 described above. Thus, in the case of this modification, the existing switching module 5 (unimproved module 100) can be employed by modifying merely a part thereof.

In this modification, the electric conductive layer 50 is provided in the frame member 41 of the cooler 10. Thus, it is not possible to make a direct connection with the constant potential portion in the switching module 5. On the other hand, in this modification, a first connection portion 55 connected to the electric conductive layer 50 is provided outside the cooler 10.

Corresponding to such a portion, a second connection portion 56 connected to the negative-side line terminal portion 106b (one example of the constant potential portion) is provided outside the case cover 103. The first connection portion 55 and the second connection portion 56 are connected to each other via a connector 57.

Thus, also in this case, features and advantages similar to those of the first applied inverter 31 are obtained.

(Second Applied Inverter)

Figure 15:
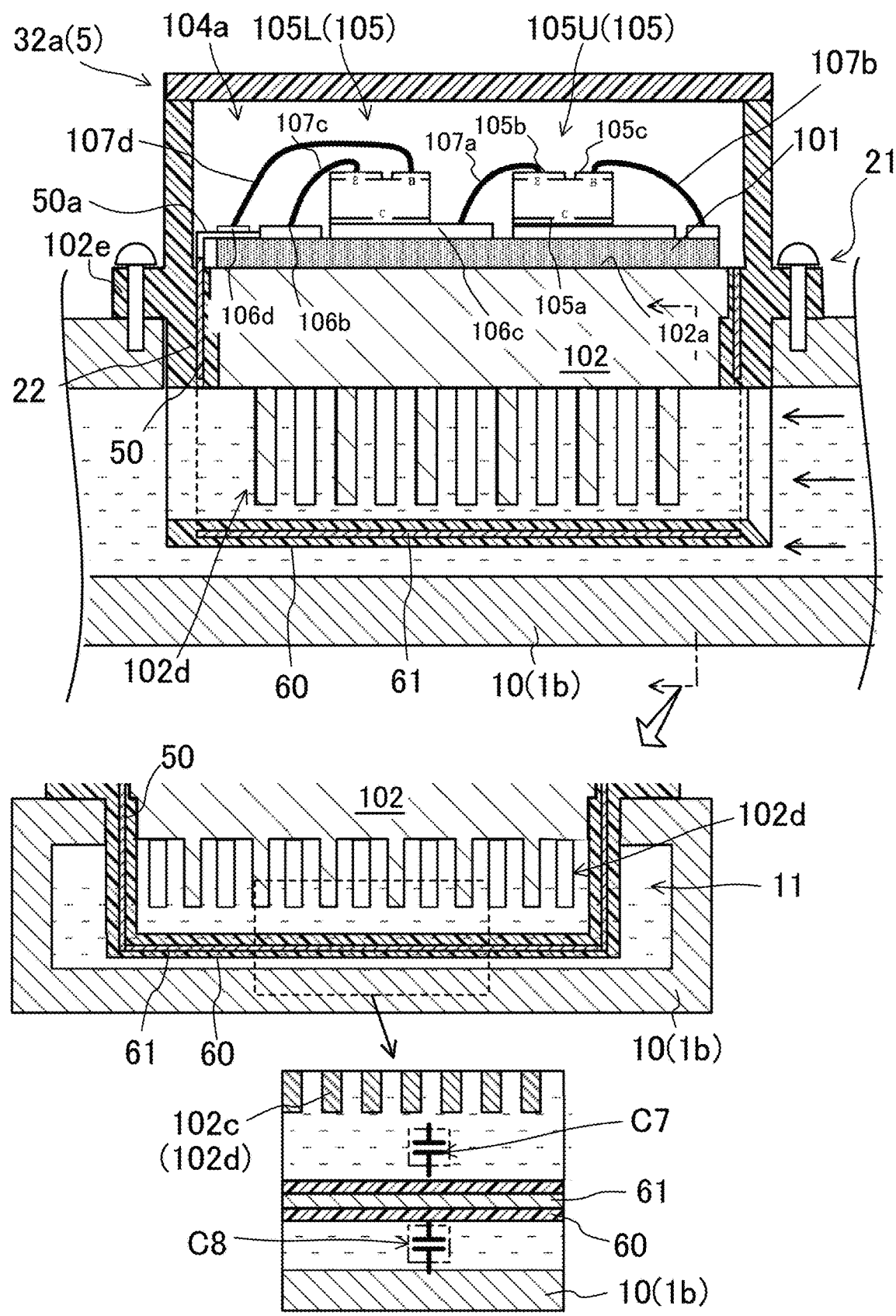
FIG. 15 is a schematic view of a second applied inverter, FIG. 15 corresponding to FIG. 10.
Figure 16:
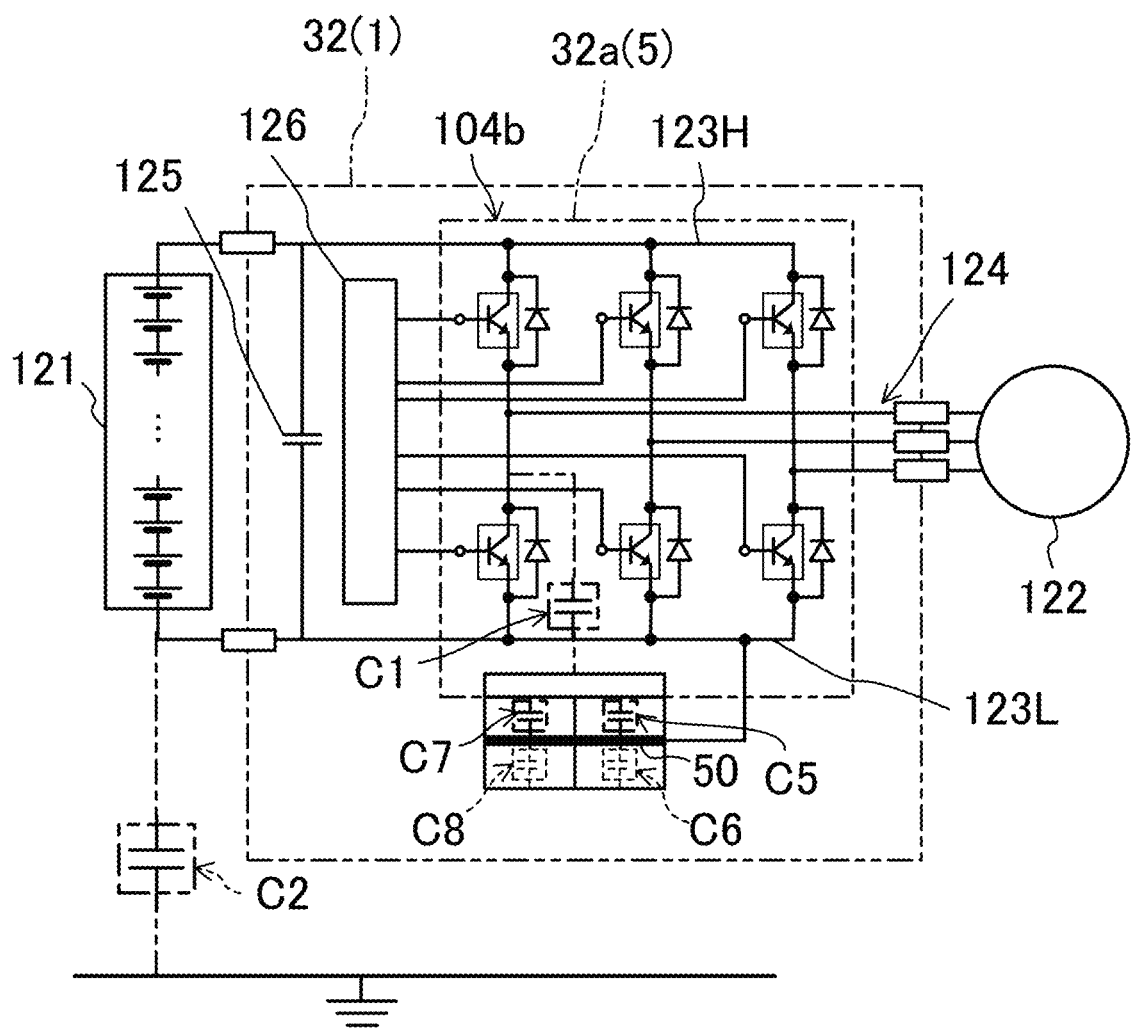
FIG. 16 is a circuit diagram of the second applied inverter.

FIGS. 15 and 16 illustrate an application (second applied inverter 32) of the first applied inverter 31. FIG. 15 is a schematic cross-sectional view corresponding to FIG. 10. That is, FIG. 15 illustrates the switching module 5 (second applied module 32a) of the second applied inverter 32. FIG. 16 is a schematic diagram illustrating the configuration of the second applied inverter 32.

The second applied inverter 32 is different from the first applied inverter 31 in that the common mode current suppression structure 21 further includes a partition member 60.

More specifically, the insulating partition member 60 surrounding the periphery of the heat radiation portion 102d of the heat sink 102 is provided in the case cover 103. The partition member 60 is provided such that a tubular portion along the refrigerant flow path 11 is further provided below the fitting portion 22 of the case cover 103.

Thus, the material of the partition member 60 is the same plastic as that of the case cover 103. The partition member 60 has a U-shaped cross section, and divides a portion where the heat radiation portion 102d and the cooler 10 face each other via refrigerant.

A second electric conductive layer 61 formed of, e.g., a copper plate or copper foil is embedded in the partition member 60. The periphery of the second electric conductive layer 61 is covered with plastic, thereby being insulated from refrigerant.

Thus, the portion where the heat radiation portion 102d (more specifically, the protruding end of each heat radiation protrusion 102c) and the inner surface of the cooler 10 face each other with refrigerant interposed therebetween is divided by the electric conductive layer 50 with these portions electrically insulated from each other. Accordingly, as illustrated in FIG. 15 in close-up, the fourth virtual capacitor C4 illustrated in FIG. 10 is divided into two virtual capacitors C connected in series.

That is, the fourth virtual capacitor C4 is divided into a seventh virtual capacitor C7 formed between the heat radiation portion 102d and the second electric conductive layer 61 and an eighth virtual capacitor C8 formed between the second electric conductive layer 61 and the inner surface of the cooler 10.

As illustrated in FIG. 15, the second electric conductive layer 61 is formed integrally with the electric conductive layer 50 via a pair of upper edge portions of the second electric conductive layer 61, and is electrically connected to the electric conductive layer 50. The electric conductive layer 50 and the second electric conductive layer 61 are connected to the negative-side line 123L via the connection end portion 50a.

Thus, the potentials of the electric conductive layer 50 and the second electric conductive layer 61 are the same as the potential of the negative electrode of the high-voltage battery 121. Even when the switching element 105 of the lower arm chip 105L is turned on and off by the switching control, the charging and discharging are carried out in the seventh virtual capacitor C7 accordingly thereto. Thus, there is no potential difference between the opposing portions of the second electric conductive layer 61 and the inner surface of the cooler 10. Therefore, no charge is accumulated in the eighth virtual capacitor C8.

Thus, as simply illustrated in FIG. 16, no common mode current flows not only in the current path passing through the fifth virtual capacitor C5 and the sixth virtual capacitor C6, but also a current path passing through the seventh virtual capacitor C7 and the eighth virtual capacitor C8.

Thus, there is no current path in which the common mode current flows. Thus, the common mode noise can be prevented, i.e., the common mode current is not reduced, but can be substantially eliminated.

In this case, no common mode current flows in the current path passing through the seventh virtual capacitor C7 and the eighth virtual capacitor C8 including refrigerant as the dielectric. Thus, not only the cooling oil but also the cooling water can be employable as refrigerant. This configuration provides a greater degree of freedom in selecting the refrigerant and excellent convenience.

(Modification of Second Applied Inverter)

Figure 17:
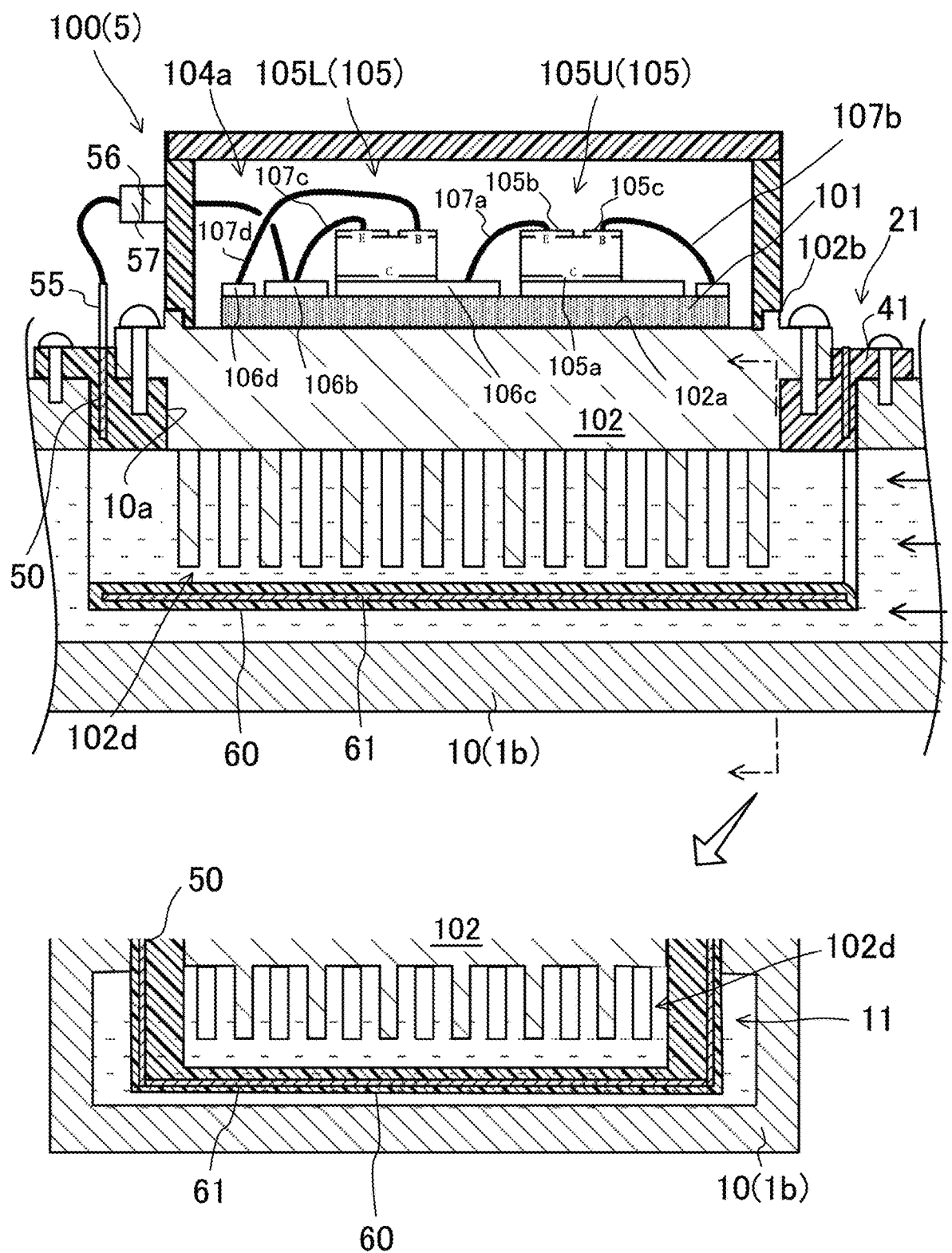
FIG. 17 is a view for describing a modification of the second applied inverter.

FIG. 17 illustrates a modification of the second applied inverter 32. In this modification, the common mode current suppression structure 21 is formed by modifying the structure of the cooler 10, as in the first applied inverter 31 described above. Thus, in the case of this modification, the existing switching module 5 (unimproved module 100) can be employed by modifying merely a part thereof.

In this modification, the electric conductive layer 50 is provided in the frame member 41 of the cooler 10. Thus, in this modification, the first connection portion 55 connected to the electric conductive layer 50 is provided outside the cooler 10. Corresponding to such a portion, the second connection portion 56 connected to the negative-side line terminal portion 106b (one example of the constant potential portion) is provided outside the case cover 103. The first connection portion 55 and the second connection portion 56 are connected to each other via the connector 57.

Thus, also in this case, features and advantages similar to those of the second applied inverter 32 are obtained.

The technique disclosed herein is not limited to the embodiments and also includes various other configurations. For example, the characteristic configurations described in the embodiments including the above-described modifications, applications, etc. are not limited to these embodiments etc. in which they are described. These configurations can also be applied to other embodiments etc. as needed.

A well-known semiconductor chip such as a MOSFET, a bipolar transistor, an IGBT, or GaN can be applied to the switching element.

DESCRIPTION OF REFERENCE CHARACTERS

1 Inverter
1a Electric Component Portion
1b Cooling Portion
5 Switching Module
10 Cooler
10a Fitting Port
20 Improved Module (Switching Module)
21 Common Mode Current Suppression Structure
22 Fitting Portion
30 Improved Inverter (Inverter to which technique disclosed herein is applied)
31 First Applied Inverter
31a First Applied Module
32 Second Applied Inverter
32a Second Applied Module
41 Frame Member
50 Electric conductive Layer
50a Connection End Portion
52 Capacitor
55 First Connection Portion
56 Second Connection Portion
57 Connector
60 Partition Member
61 Second Electric Conductive Layer
100 Unimproved Module
101 Substrate (Insulating Layer)
102 Heat Sink
102a Heat Receiving Portion
102c Heat Radiation Protrusion
102d Heat Radiation Portion
103 Case Cover
104 Electronic Circuit
104a Inverter Circuit
104b Half-Bridge Circuit
105 Switching Element
105U Upper Arm Chip
105L Lower Arm Chip
105a Collector Electrode
105b Emitter Electrode
105c Base Electrode
106 Electrode Conductor
106a Positive-Side Line Terminal Portion
106b Negative-Side Line Terminal Portion
106c Output Line Terminal Portion
106d Switching Terminal Portion
120 Unimproved Inverter
121 High-Voltage Battery
122 Drive Motor
123H Positive-Side Line
123L Negative-Side Line
124 Output Line
125 Smoothing Capacitor
126 Control Circuit
C1 to C8 Virtual Capacitors

What is claimed is:

1. An inverter comprising: an electric component portion housing an electronic component including a switching module, and a cooling portion integrated with the electric component portion, wherein
the switching module includes:
an insulating layer having, on the upper surface thereof, an electronic circuit including an inverter circuit; and
a heat sink having, at an upper portion thereof, a heat receiving portion joined to a lower surface of the insulating layer and having, at a lower portion thereof, a heat radiation portion,
the cooling portion including an electric conductive cooler forming a refrigerant flow path,
the switching module being attached to the cooler such that the heat radiation portion is exposed to an inside of the cooler through a fitting port, and
the inverter comprises a common mode current suppression structure including an insulating member and being interposed between the heat sink and the cooler to electrically insulate the heat sink and the cooler from each other, wherein
the switching module further includes an insulating case cover covering the insulating layer,
an end portion of the case cover is fitted in the fitting port to form the common mode current suppression structure,
the cooling portion further includes an insulating frame member forming the fitting port, and
the frame member is attached to the cooling portion to form the common mode current suppression structure.

2. The inverter of claim 1, wherein
the common mode current suppression structure includes
an electric conductive layer embedded in the insulating member, and
opposing portions of the heat sink and the cooler are divided by the electric conductive layer electrically insulatively from each other, and the electric conductive layer is electrically connected to a constant potential portion in the electric component portion held at a predetermined potential.

3. The inverter of claim 2, wherein
the constant potential portion is a portion of a negative-side line connected to the inverter circuit.

4. The inverter of claim 3, wherein
the refrigerant is cooling water.

5. The inverter of claim 2, wherein
the constant potential portion is a portion of a positive-side line connected to the inverter circuit.

6. The inverter of claim 5, wherein
the refrigerant is cooling water.

7. The inverter of claim 2, further comprising:
two capacitors connected in series between a positive-side line and a negative-side line, to which the inverter circuit is connected, wherein
the constant potential portion is a portion between the two capacitors.

8. The inverter of claim 7, wherein
the refrigerant is cooling water.

9. The inverter of claim 2, wherein
the switching module further includes an insulating case cover covering the insulating layer,
an end portion of the case cover is fitted in the fitting port to form the common mode current suppression structure, and
the conductive layer has a connection end portion exposed to an inside of the case cover, and the conductive layer and the constant potential portion are connected to each other via the connection end portion.

10. The inverter of claim 9, wherein
the refrigerant is cooling water.

11. The inverter of claim 2, wherein
the cooling portion further includes an insulating frame member forming the fitting port,
the frame member is attached to the cooling portion to form the common mode current suppression structure, and
the inverter includes: outside the cooler, a first connection portion connected to the electric conductive layer; outside the case cover, a second connection portion connected to the constant potential portion, the first connection portion and the second connection portion being connected to each other via a connector.

12. The inverter of claim 11, wherein
the refrigerant is cooling water.

13. The inverter of claim 2, wherein
the common mode current suppression structure further includes an insulating partition member extending along the refrigerant flow path so as to divide a portion where the heat radiation portion and the cooler face each other via the refrigerant, and
the inverter includes a second electric conductive layer connected to the conductive layer and embedded in the partition member.

14. The inverter of claim 13, wherein
the refrigerant is cooling water.

15. The inverter of claim 4, wherein
the refrigerant is cooling water.

16. The inverter of claim 1, wherein
the refrigerant is cooling oil.

17. The inverter of claim 1, wherein
the refrigerant is cooling water.

18. The inverter of claim 1, wherein
the refrigerant is cooling water.

* * * * *